Figure 1:
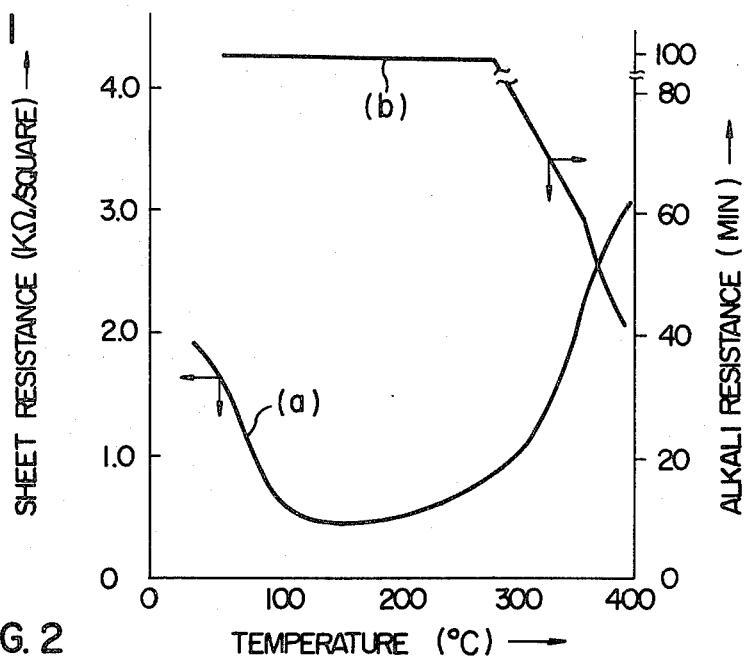

United States Patent [19]

Sasaki et al.

[11] 4,431,683
[45] Feb. 14, 1984

[54] PROCESS FOR PRODUCING TRANSPARENT ELECTROCONDUCTIVE FILM

[75] Inventors: Ken Sasaki, Mobara; Kiyoshige Kinugawa, Chiba; Yoshio Hanada, Mobara; Keiichi Aoki, Mobara; Akira Ishii, Mobara; Masaharu Koyama, Mobara, all of Japan

[73] Assignee: Hitachi, Ltd., Tokyo, Japan

[21] Appl. No.: 368,666

[22] Filed: Apr. 15, 1982

[30] Foreign Application Priority Data

Apr. 24, 1981 [JP] Japan .................................. 56-61191

[51] Int. Cl.³ .......................... B05D 3/06; B05D 5/04; B05D 3/04; B05D 1/18
[52] U.S. Cl. ...................................... 427/39; 427/38; 427/54.1; 427/108; 427/169
[58] Field of Search .................. 427/38, 54.1, 39, 108, 427/169

[56] References Cited

U.S. PATENT DOCUMENTS 4,268,539 5/1981 Nakayama et al. ................. 427/108
4,303,554 12/1981 Sudo et al. ...................... 427/108 X
4,369,208 1/1983 Okunaka et al. ................ 427/108 X

*Primary Examiner*—James R. Hoffman
*Attorney, Agent, or Firm*—Antonelli, Terry & Wands

[57] ABSTRACT

A transparent electroconductive film formed on a glass substrate by a special wettability-improving treatment of the surface portion of a SiO₂ film formed on the glass substrate, followed by coating with an indium complex solution, drying, irradiation with ultraviolet light and calcination, has low sheet resistance, good film properties and high quality.

17 Claims, 3 Drawing Figures

PROCESS FOR PRODUCING TRANSPARENT ELECTROCONDUCTIVE FILM

This invention relates to a process for producing a transparent electroconductive film on a glass substrate.

Heretofore, a transparent electroconductive film is formed, for example, by dipping a glass substrate in an indium complex solution and taking it out of the solution, followed by calcination. According to such a process, since specific resistance of the formed film is high, it is necessary to coat the film with a thickness of 1000 Å or more. Further, since wettability of the substrate is poor, a film with a uniform thickness is hardly obtainable. In addition, such a film is poor in alkali resistance. Therefore, such a film cannot be used practically. Needless to say, a process wherein the film is formed by one coating is advantageous economically. But in order to form a thick film by one coating, it is necessary to make the concentration of the indium complex solution high, which results in easily generating cracks on the film formed and making the operation difficult. On the other hand, when the film is formed by a multi-layer coating process, the process becomes complicated due to an increased number of procedures, and there also arise problems in the quality of the film, particularly in durability of the film under high humidity.

This invention provides a process for producing a transparent electroconductive film having a thin thickness, low resistance and high quality with low costs overcoming the disadvantages mentioned above.

More concretely, this invention provides a process for producing a transparent electroconductive film on a glass substrate which comprises:
a step of forming a $SiO_2$ film on a glass substrate,
a step of treating the $SiO_2$ film for improving wettability for an indium complex solution,
a step of applying an indium complex solution to the treated $SiO_2$ film,
a step of drying the indium complex solution,
a step of irradiating ultraviolet light on the coated substrate, and
a step of calcining the coated substrate while removing organic materials by calcination.

Figure 2:
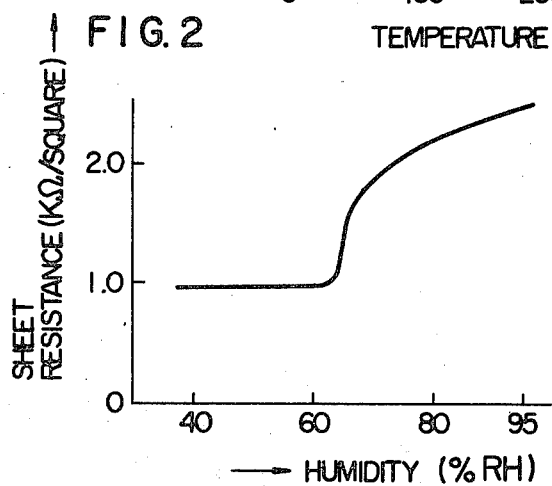
Figure 3:
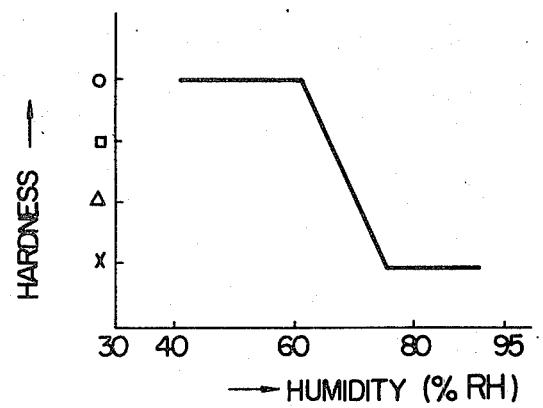

In the attached drawing,
FIG. 1 is a graph showing relationships between drying temperatures for removing an organic solvent from an indium complex solution coated on a glass substrate and film properties of the resulting transparent electroconductive films, and
FIGS. 2 and 3 are graphs showing relationships between humidity from the step of applying the indium complex solution to the step of irradiation of ultraviolet light and the film properties.

This invention will be explained in detail below.

In the first step, a $SiO_2$ film is formed on a glass substrate by a conventional process. A coating solution can be prepared, for example, by dissolving a hydroxide of silicon compound in an organic solvent, said hydroxide of silicon compound having been obtained by reacting tetrachlorosilane with acetic anhydride to give a silane, followed by hydrolysis using a catalyst. The resulting coating solution is coated on a glass substrate which has been cleaned and dried using a conventional coating method. Then, the coated solution is calcined so as to remove the organic matters and to form a $SiO_2$ film.

The formation of $SiO_2$ film on the glass substrate is necessary for preventing alkalis present in the glass substrate from diffusing into the transparent electroconductive film. That is, particularly in the final calcination step in the formation of a transparent electroconductive film, alkalis such as Na, K, etc., contained in the glass substrate readily diffuse into the transparent electroconductive film, which results in increasing resistance of the transparent electroconductive film extremely. The thickness of the $SiO_2$ film necessary for preventing this diffusion is changeable depending on the quality of the film and is 150 Å at least, preferably about 500 Å or more. On the other hand, if the film thickness is too large, for example more than 2000 Å, the film becomes brittle and this thickness easily causes cracks, so that the film thickness is preferably 2000 Å or less. Further, since the quality of the film is influenced by calcination conditions of the $SiO_2$ film, the calcination temperature is preferably in the range of 370°–550° C. By the formation of the $SiO_2$ film, unfavorable influence of the alkalis in the glass substrate can be avoided, even if an expensive glass containing no alkali is not used as the substrate. Thus any glass can be used as the substrate.

The resulting $SiO_2$ film coated substrate is subjected to a treatment for improving wettability for an indium complex solution. Since the surface of the calcined $SiO_2$ film is extremely poor in wettability for a liquid, it repels, for example, an alcohol, acetone, or the like. Reasons for this phenomenon are not clear but one reason for its seems to be that the $SiO_2$ film immediately after the calcination is very active and can easily adsorb molecules having a small surface energy. Further, it is also possible that since the surface layer of the $SiO_2$ film is not completely $SiO_2$ film, molecules having a small surface energy preferentially predominate the surface layer.

The wettability-improving treatment is conducted by removing the surface portion of the $SiO_2$ film. In order to remove the surface portion of the $SiO_2$ film, there can be employed various methods such as a dip method in an alkali aqueous solution, a dip method in an aqueous solution of ammonium fluoride and/or hydrogen fluoride, a plasma treatment method in an atmosphere of carbon tetrafluoride, a hot water treatment method, and the like. The removal of the surface portion of the $SiO_2$ film can be conducted so as to retain at least 50 Å in thickness and to remove at least 50 Å and preferably 100 Å or more in thickness.

In the case of the dip method in an alkali aqueous solution, it is preferable to use the alkali solution having a high concentration. Further, it is necessary to carry out aftertreatments such as neutralization by dipping in an aqueous acid solution and washing with water, followed by drying. If the aftertreatments are insufficient, for example, only conducting water washing, the alkali may retain on the surface and make the resistance of the resulting transparent electroconductive film high. As the aqueous alkali solution, there can be used an aqueous solution of NaOH, KOH, LiOH or the like with a concentration of preferably 2 to 20% by weight.

In the case of the dip method in an aqueous solution of ammonium fluoride and/or hydrogen fluoride, the removal of the surface portion of the $SiO_2$ film can be conducted by using the aqueous solution having a relatively low concentration in a short time. The action of the aqueous solution to the $SiO_2$ film seems to be as follows:

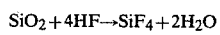

$$SiO_2 + 4HF \rightarrow SiF_4 + 2H_2O$$

This fundamental mechanism is the same either in the case of using an aqueous solution of hydrogen fluoride, ammonium fluoride or a mixture thereof. In order to make the concentration of hydrogen fluoride constant, the use of an aqueous solution of a mixture of ammonium fluoride and hydrogen fluoride is preferable due to a function as a buffer solution. The corrosion speed of the $SiO_2$ film is accelerated by increasing the concentration of the aqueous solution of hydrogen fluoride and/or ammonium fluoride. As a result of various investigation, it is revealed that the minimum corrosion depth of the $SiO_2$ film necessary for improving the wettability is about 50 Å and if the corrosion depth is less than 50 Å, nonuniformity of wettability is easily resulted due to nonuniform corrosion. Thus, it is preferable to use an aqueous solution of hydrogen fluoride and/or ammonium fluoride with a concentration of 0.001 to 3% by weight. When the concentration is lower than 0.001% by weight, the corrosion speed is too slow and it requires more than 300 seconds to obtain a suitable corrosion depth: this is not practical. It is possible to increase the corrosion speed by raising the temperature, but since the practical work should be carried out below 50° C. so as not to produce much hydrofluoric acid vapor, this temperature rise cannot be employed practically and there is little change in corrosion depth below 50° C. On the other hand, when the concentration is too high, for example more than 3% by weight, it is necessary to make the dipping time less than 5 seconds: this is practically impossible considering control of the procedure. That is, after dipped in the aqueous solution of hydrogen fluoride and/or ammonium fluoride, the thus treated substrated is taken out and preferably washed with flowing water immediately, but in practice, the immediate washing with flowing water is difficult and the substrate is allowed to stand for several seconds undesirably after taken out of the solution. Further, since the corroding amount of $SiO_2$ is large, the change in concentration of the solution becomes vigorous: this also makes the control difficult. The dipping time is preferably 5 to 300 seconds.

The same effect as mentioned can also be attained by coating an aqueous solution of hydrogen fluoride and/or ammonium fluoride preferably in a concentration of 0.001 to 3% by weight on the $SiO_2$ film for preferably 5 to 300 seconds.

In each case, the resulting substrate is washed and dried.

The wettability-improving treatment can also be conducted by a plasma treatment in an atmosphere of carbon tetrachloride. Since this process is a so-called dry process and does not require other additional treatment such as drying, it is a very advantageous process. The plasma treatment can preferably be conducted in a degree of vacuum of 0.5 to 2 mmHg, for 30 to 300 seconds to give corrosion of the film from 100 to 1000 Å in thickness. In the plasma treatment in an atmosphere of carbon tetrafluoride, if the treatment time is too short, only a roughened surface is undesirably obtained. This is because the corrosion proceeds ununiformly and weak portions seem to be corroded preferentially. Thus, the corrosion of about 50 Å in thickness is insufficient for improving the wettability and the corrosion of at least about 100 Å in thickness is necessary for sufficient wettability improvement.

It is also possible to improve the wettability by treating the $SiO_2$ film coated substrate with hot water heated at 80° to 100° C. or with heated steam.

Further, the surface portion of the $SiO_2$ film can also be removed by mechanical rubbing processes such as brushing, and the like.

The thus treated substrate is, if necessary, washed and dried, and then is subjected to application of an indium complex solution by a conventional method such as dipping, spin or roll coating, or the like.

The indium complex solution can be prepared by mixing one or more indium compounds, tin compounds, complex-making compounds and solvents. As the indium compounds, there can preferably be used chlorides, nitrates, perchlorates of indium such as $InCl_3.4H_2O$, $In(NO_3)_3.3H_2O$, $In(ClO_4)_3.8H_2O$, etc. As the tin compounds, there can preferably be used organotin compounds such as hexaalkylditin, dimethyltin oxide, tin octoate, etc. As the complex-making compounds, there can preferably be used polybasic carboxylic acids such as dibasic acids, e.g. citraconic acid, succinic acid, maleic acid, glutaric acid, phthalic acid, and anhydrides thereof, tribasic or higher polybasic carboxylic acids. As the solvents, there can be used organic solvents, e.g., ketones such as acetone, methyl ethyl ketone, etc., alcohols such as methanol, ethanol, ethylene glycol, etc., Cellosolves such as ethyl Cellosolve, butyl Cellosolve, etc. Such an indium complex solution and preparation thereof are disclosed in, for example, U.S. Pat. No. 4,303,554.

The indium complex solution is applied to the $SiO_2$ film treated for improving the wettability so as to give a film thickness of preferably 150 to 1000 Å after calcined.

The applied indium complex solution is then dried by a conventional process to remove the organic solvent.

After dried, the indium complex coated substrate is irradiated with ultraviolet light.

One important thing in the process of this invention is to maintain the relative humidity (RH) of the atmosphere during the indium complex solution application step, the drying step and the ultraviolet light irradiation step preferably at 65% or less. If the RH is higher than 65%, electric resistance and hardness of the resulting transparent electroconductive film will be extremely deteriorated as shown in FIGS. 2 and 3. In order to remove undesirable influence of humidity, it is possible to raise the drying temperature, but considering influences on alkali resistance, hardness of the resulting transparent electroconductive film, the upper limit of the drying temperature is about 350° C. The reason for this seems to be as follows: Properties of the transparent electroconductive film such as electric resistance, alkali resistance, hardness, etching resistance, etc., are greatly influenced by the amount of impurities contained in the film. When the drying temperature is raised too high, the organic materials contained in the indium complex solution, mainly the complex-making compounds, are carbonized and retained in the film as impurities without decomposition by the irradiation with ultraviolet light and the final calcination. Therefore, it is necessary to dry the indium complex solution at a temperature not to produce a substance such as a carbonized organic matter which is not decomposable by ultraviolet light irradiation.

After dried, the resulting substrate is subjected to irradiation with ultraviolet light. As mentioned above, in order to give good film properties as transparent electroconductive film, it is important how to remove the organic matters in the indium complex solution. Some components which are not easily decomposable by heating are retained as residues in the film to worsen the film properties. It is very effective to irradiate with ultraviolet light so as to reduce such residues before the calcination. That is, among organic materials used, those which are difficult to be decomposed by heating are the complex-making compounds, i.e., carboxylic acids and anhydrides thereof, which can bring about decarbonation reaction by irradiation with ultraviolet light. Thus, it becomes possible to reduce remarkably the amount of residues as impurities in the film together with the successive calcination treatment. In order to make the ultraviolet light irradiation effective, it is preferable to irradiate with an intensity of 5 mW/cm² or more together with heating preferably at 370°–430° C. As an ultraviolet light source, there can be used conventional ones.

After irradiation with ultraviolet light, the resulting substrate is subjected to calcination. Since the substrate is already excited by irradiation with ultraviolet light, the calcination can be carried out at 450° C. or higher and below the softening point of the glass for 5 minutes or longer. By the calcination, the organic materials in the indium complex solution can be removed sufficiently. One example of the calcination conditions is 500° C. for 30 minutes.

The resulting transparent electroconductive film is suitable for use in liquid crystal display elements, electroluminescent display elements, electrochromic display elementents and the like.

This invention will be illustrated by way of the following Examples.

EXAMPLES

Each glass substrate of 100×100×0.7 mm was dipped in an alkali solution containing a surface active agent at 40° C. for 5 minutes. Then, the substrate was subjected to ultrasonic cleaning, followed by washing with flowing water for 5 minutes. Then, the substrate was dipped in hot water at 50° C. for 5 minutes, dipped in isopropyl alcohol to conduct a dehydration treatment, dipped in a liquid Freon at 42° C. and dried with Freon vapor. Then, the substrate was dipped in a 8% by weight solution of hydroxylated silicon compound, which had been obtained by the reaction of tetrachlorosilane with acetic anhydride, followed by hydrolysis, dissolved in a mixed solvent of acetone, methyl ethyl ketone, and methyl acetate in a weight ratio of 1:1:1 for 2 minutes and then taken out of the solution to form a thin film. After allowed to stand at room temperature for 5 minutes for drying, the substrate was heated at 500° C. for 30 minutes to remove the organic materials and to form a $SiO_2$ film having a thickness as shown in Table 1.

Subsequently, the substrate was subjected to the wettability-improving treatment as shown in Table 1, in which the sample of No. 1 was not treated at all for comparison and the samples of Nos. 2 to 11 were treated by various methods.

After washing and drying, an indium complex solution was applied to the substrate using a spinner at 600 rpm. The indium complex solution was prepared by mixing 7.5 g of indium nitrate, 0.5 g of dimethyltin oxide, 1.0 g of citraconic acid, 0.5 g of nitric acid, 86 g of ethanol and 4.5 g of ethylene glycol. The film thickness after calcination was 400±50 Å.

Then, the substrate was heated at 200° C. for 30 minutes to remove the organic solvents. Subsequently, the substrate was subjected to irradiation with ultraviolet light at an intensity of 100 mW/cm² for 1 minute, while maintaining the temperature at 400° C. During the coating of indium complex solution, drying and ultraviolet light irradiation, the relative humidity of the atmosphere was maintained at 50%.

Finally, the substrate was calcined at 500° C. for 30 minutes.

Film properties of the resulting transparent electroconductive films were tested and listed in Table 1.

TABLE 1

| No. | Wettability-improving treatment | Removed thickness of $SiO_2$ film*[1] (Å) |
|---|---|---|
| 1 | No treatment | — |
| 2 | Dipped in 5% NaOH aq. soln. for 10 min. + washing with water | 70–100 |
| 3 | Dipped in 5% NaOH aq. soln. for 10 min. + dipped in 5% $HNO_3$ soln + washing with water | 70–100 |
| 4 | Dipped in hot water at 90° C. for 1 hr. | <20 |
| 5 | Dipped in hot water at 90° C. for 2 hrs. | 40–60 |
| 6 | Dipped in 0.001% hydrofluoric acid for 5 min. + washing with water | 60–80 |
| 7 | Dipped in 3% hydrofluoric acid for 5 sec. + washing with water | 150–200 |
| 8 | Dipped in 5% hydrofluoric acid for 5 sec. | 300–400 |
| 9 | Plasma treatment in $CF_4$ (3 mmHg) for 1 min. | 40–70 |
| 10 | Plasma treatment in $CF_4$ (5 mmHg) for 10 sec. | <20 |
| 11 | Plasma treatment in $CF_4$ (3 mmHg) for 10 min. | 350–800 |

Note
*[1]Original $SiO_2$ film thickness 1000 Å, obtained by heated at 500° C. for 30 min.

| Wettability | Resistance of transparent electroconductive film | Alkali resistance of transparent electroconductive film |
|---|---|---|
| x | — | — |
| o | x | Δ |
| o | o | o |
| x | — | — |
| Δ - o | o | o |
| o | o | o |
| o | o | o |
| o | o | o |
| o | o | o |
| x | — | — |
| o | x | o |

In Table 1, the mark o means good, the mark Δ not so good but not so bad, and the mark x bad. As is clear from Table 1, transparent electroconductive films having remarkably good properties can be obtained by conducting the wettability-improving treatment under proper treatment conditions compared with the case of no treatment (No. 1).

Further, when the drying temperature after coating the indium complex solution on wettability-improvement treated surfaces according to the method of No. 6 in Table 1 is changed upto 400° C., resistance and alkali resistance of the resulting transparent electroconductive films are changed as shown in FIG. 1, in which the curve (a) shows a relationship between resistance and drying temperature and the curve (b) shows a relationship between alkali resistance and the drying temperature. The sheet resistance was measured by using a sheet resistance measuring apparatus (mfd. by Kokusai Denki, K.K., Japan). The alkali resistance was evaluated by dipping a substrate in a 5% by weight aqueous solution of NaOH at 55±2° C. and measuring a time required for the delamination of the film from the substrate.

Further, film properties are changed as shown in FIGS. 2 and 3, when the relative humidity during the coating of indium complex solution, drying and ultraviolet light irradiation are changed variously as to the substrates subjected to the wettability-improving treatment of No. 6 in Table 1. The hardness was measured by rubbing a surface of film with a pencil eraser corresponding to that defined in the item 4.6.11 of MIL-C-675A (U.S. Military Specifications) and evaluated the degree of scratching with the marks o-□-Δ-x from good to bad in this order. FIGS. 2 and 3 clearly show the importance of control of relative humidity during the coating of indium complex solution, drying and ultraviolet light irradiation.

As mentioned above, according to this invention, thin transparent electroconductive films with low sheet resistance and high quality can be formed with low cost by forming a SiO$_2$ film on a glass substrate, treating the surface portion of the SiO$_2$ film for improving wettability, applying an indium complex solution to the surface-treated SiO$_2$ film, drying, irradiating with ultraviolet light, followed by calcination.

What is claimed is:

1. A process for producing a transparent electroconductive film on a glass substrate which comprises:
    a step of forming a SiO$_2$ film on a glass substrate,
    a step of removing a portion of the surface of the SiO$_2$ film to improve the wettability of the SiO$_2$ film for an indium complex solution,
    a step of applying an indium complex solution to the SiO$_2$ film having improved wettability,
    a step of drying the indium complex solution,
    a step of irradiating with ultraviolet light the coated substrate, and
    a step of calcining the coated substrate while removing organic materials by calcination.

2. A process according to claim 1, wherein the wettability-improving step is carried out by dipping the SiO$_2$ film in an aqueous alkali solution.

3. A process according to claim 1, wherein the wettability-improving step is conducted by coating the SiO$_2$ film with an aqueous solution of ammonium fluoride and/or hydrogen fluoride.

4. A process according to claim 3, wherein the coating is conducted for 5 to 300 seconds.

5. A process according to claim 1, wherein the wettability-improving step is conducted by by dipping the SiO$_2$ film in an aqueous solution of ammonium fluoride and/or hydrogen fluoride.

6. A process according to claim 5, wherein the dipping is conducted for 5 to 300 minutes.

7. A process according to claim 3 or 5, wherein the concentration of the aqueous solution of ammonium fluoride and/or hydrogen fluoride is 0.001 to 3% by weight.

8. A process according to claim 1, wherein the wettability-improving step is conducted by a plasma treatment in an atmosphere of carbon tetrafluoride.

9. A process according to claim 8, wherein the plasma treatment is conducted for 30 to 300 seconds.

10. A process according to claim 1, wherein the step of application of the indium complex solution, the step of drying of the indium complex solution and the step of irradiation with ultraviolet light are conducted under an atmosphere having a relative humidity of 65% or less.

11. A process according to claim 1, wherein the drying of the indium complex solution is conducted at a temperature of 350° C. or lower.

12. A process according to claim 1, wherein the irradiation with ultraviolet light is conducted with an intensity of 5 mW/cm$^2$ or more.

13. A process according to claim 12, wherein the irradiation with ultraviolet light is conducted with heating at a temperature of 370° to 430° C.

14. A process according to claim 1, wherein the calcination is conducted at a temperature of 450° C. or higher for 5 minutes or more.

15. A process according to claim 1, wherein the wettability-improving step is conducted by contacting the SiO$_2$ film with hot water.

16. A process according to claim 1, wherein the wettability-improving step is conducted by contacting the SiO$_2$ film with heated steam.

17. A process according to claim 1, wherein the wettability-improving step is conducted by mechanically rubbing the SiO$_2$ film.

* * * * *